United States Patent
Wu

(10) Patent No.: US 11,404,509 B2
(45) Date of Patent: Aug. 2, 2022

(54) DISPLAY PANEL WHERE OPENING RATES OF FIRST AND SECOND SUBPIXELS ARE LESS THAN THAT OF A THIRD SUBPIXEL WHILE CHANNEL RATIOS OF THE FIRST AND SECOND SUBPIXELS ARE GREATER THAN THAT OF THE THIRD SUBPIXEL AND DISPLAY APPARATUS

(71) Applicants: HKC CORPORATION LIMITED, Shenzhen (CN); CHONGQING HKC OPTOELECTRONICS TECHNOLOGY CO., LTD., Chongqing (CN)

(72) Inventor: Chuan Wu, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 826 days.

(21) Appl. No.: 16/319,353

(22) PCT Filed: Nov. 21, 2018

(86) PCT No.: PCT/CN2018/116615
§ 371 (c)(1),
(2) Date: Jan. 21, 2019

(87) PCT Pub. No.: WO2020/062507
PCT Pub. Date: Apr. 2, 2020

(65) Prior Publication Data
US 2021/0359052 A1    Nov. 18, 2021

(30) Foreign Application Priority Data
Sep. 30, 2018 (CN) .......................... 201821622873.6

(51) Int. Cl.
*H01L 27/32* (2006.01)
*H01L 27/12* (2006.01)
*H01L 51/50* (2006.01)

(52) U.S. Cl.
CPC ...... *H01L 27/3262* (2013.01); *H01L 27/1214* (2013.01); *H01L 51/504* (2013.01)

(58) Field of Classification Search
CPC ............. H01L 27/3262; H01L 27/1214; H01L 51/504
(Continued)

(56) References Cited

U.S. PATENT DOCUMENTS

2003/0197665 A1* 10/2003 Sung .................... G09G 3/3233
345/82
2011/0127531 A1* 6/2011 Kim .................. H01L 29/41733
257/59

(Continued)

FOREIGN PATENT DOCUMENTS

| CN | 102262854 A | 11/2011 |
| CN | 103219359 A | 7/2013 |

(Continued)

OTHER PUBLICATIONS

Ting Yang, the ISA written comments, Jun. 2019, CN.

*Primary Examiner* — Duy T Nguyen

(57) ABSTRACT

The present application discloses a display panel and a display apparatus. The display panel includes a plurality of pixels. Each of the pixels at least includes a first sub pixel, a second sub pixel and a third sub pixel corresponding to blue. The first sub pixel includes a first active switch. The second sub pixel includes a second active switch. The third sub pixel includes a third active switch. The opening rates of the first sub pixel and the second sub pixel are less than the opening rate of the third sub pixel. The channel ratios of the (Continued)

first active switch and the second active switch are greater than the channel ratio of the third active switch.

20 Claims, 3 Drawing Sheets

(58) Field of Classification Search
USPC .......................................................... 257/72
See application file for complete search history.

(56) References Cited

U.S. PATENT DOCUMENTS

| | | | |
|---|---|---|---|
| 2015/0022510 A1* | 1/2015 | Yao | G09G 3/003 |
| | | | 345/92 |
| 2015/0036067 A1* | 2/2015 | Xue | G02F 1/13306 |
| | | | 257/347 |
| 2015/0311261 A1* | 10/2015 | Choi | H01L 27/3216 |
| | | | 257/40 |
| 2016/0049124 A1 | 2/2016 | Tsuei et al. | |

FOREIGN PATENT DOCUMENTS

| | | |
|---|---|---|
| CN | 104465710 A | 3/2015 |
| CN | 105047685 A | 11/2015 |
| TW | 558693 B | 10/2003 |

* cited by examiner

DISPLAY PANEL WHERE OPENING RATES OF FIRST AND SECOND SUBPIXELS ARE LESS THAN THAT OF A THIRD SUBPIXEL WHILE CHANNEL RATIOS OF THE FIRST AND SECOND SUBPIXELS ARE GREATER THAN THAT OF THE THIRD SUBPIXEL AND DISPLAY APPARATUS

The present application claims priority to the Chinese Patent Application No. CN201821622873.6, filed with the Chinese Patent Office on Sep. 30, 2018, and entitled "DISPLAY PANEL AND ORGANIC LIGHT-EMITTING DISPLAY APPARATUS", which is incorporated herein by reference in its entirety.

TECHNICAL FIELD

The present application relates to the technical field of display, and in particular, to a display panel and a display apparatus.

BACKGROUND

The description here only provides background information related to the present application, and does not necessarily constitute the existing technology.

The organic light-emitting diode (OLED) display, also known as an organic electroluminescence diode, has various advantages such as self-illumination, short response time, high definition and contrast, and ability of realizing flexible display and large-area full-color display. The superior performance and huge market potential attract numerous plants and scientific research institutions all over the world to put the OLED (organic light-emitting diode) display panel into production and development. The OLED (organic light-emitting diode) has characteristics of high color gamut, wide viewing angle, light weight, power saving, and ability of preparing a flexible display. The standard RGB (three primary colors) light-emitting arrangement uses an FMM (fine metal mask) mask, and has high production difficulty. A solution can use a WOLED (white organic light-emitting diode)+Color Filter scheme, so that WOLED (white organic light-emitting diode) of the RGB (three primary colors) area can use the same structure, and OLED (organic light-emitting diode) evaporation can use an Open Mask to reduce the production difficulty of the process.

Long time use of the display panel will cause insufficient brightness of the blue light, thereby generating white color offset of the three primary color area.

SUMMARY

In view of the above shortages, the present application aims to provide a display panel and a display apparatus to prevent screen color offset occurred after long time use.

In order to realize the above purpose, the present application provides a display panel. The display panel includes a plurality of pixels. Each of the pixels at least includes a first sub pixel, a second sub pixel and a third sub pixel corresponding to blue. The first sub pixel includes a first active switch. The second sub pixel includes a second active switch. The third sub pixel includes a third active switch. The opening rates of the first sub pixel and the second sub pixel are less than the opening rate of the third sub pixel. The channel ratios of the first active switch and the second active switch are greater than the channel ratio of the third active switch.

Optionally, the first active switch, the second active switch and the third active switch all include a source electrode and a drain electrode; a channel is located between the source electrode and the drain electrode; the source electrode includes a semi-circular area; the radius of the semi-circular area of the source electrode of the first active switch is equal to the radius of the semi-circular area of the source electrode of the second active switch and the radius of the semi-circular area of the source electrode of the third active switch; a distance from the center of the semi-circular area of the source electrode of the first active switch to the drain electrode and a distance from the center of the semi-circular area of the source electrode of the second active switch to the drain electrode are less than a distance from the center of the semi-circular area of the source electrode of the third active switch to the drain electrode.

Optionally, the first active switch, the second active switch and the third active switch all include a source electrode and a drain electrode; a channel is located between the source electrode and the drain electrode; the source electrode includes a semi-circular area; a distance from the center of the semi-circular area of the source electrode of the first active switch to the drain electrode is equal to a distance from the center of the semi-circular area of the source electrode of the second active switch to the drain electrode and a distance from the center of the semi-circular area of the source electrode of the third active switch to the drain electrode; and the radius of the semi-circular area of the source electrode of the third active switch is less than the radius of the semi-circular area of the source electrode of the second active switch and the radius of the semi-circular area of the source electrode of the first active switch.

Optionally, the first sub pixel includes a first light-emitting diode connected with the first active switch; the second sub pixel includes a second light-emitting diode connected with the second active switch; the third sub pixel includes a third light-emitting diode connected with the third active switch; the first, second and third light-emitting diodes all include a light-emitting area; and the area of the light-emitting area of the third light-emitting diode is greater than the areas of the light-emitting areas of the first light-emitting diode and the second light-emitting diode.

Optionally, the ratio x of the opening rates of the first sub pixel and the third sub pixel is greater than or equal to 0.4, and less than 0.95.

Optionally, the value of x is 0.9, 0.85 or 0.8.

Optionally, the ratio y of the opening rates of the second sub pixel and the third sub pixel is greater than or equal to 0.4, and less than 0.95.

Optionally, the value of y is 0.9, 0.85 or 0.8.

The present application also provides a display panel, including a plurality of pixels; each of the pixels at least includes a first sub pixel, a second sub pixel and a third sub pixel corresponding to blue; the first sub pixel includes a first active switch; the second sub pixel includes a second active switch; the third sub pixel includes a third active switch; the opening rates of the first sub pixel and the second sub pixel are less than the opening rate of the third sub pixel; and the channel ratios of the first active switch and the second active switch are greater than the channel ratio of the third active switch;

the first active switch, the second active switch and the third active switch all include a source electrode and a drain electrode; a channel is located between the source electrode and the drain electrode; the source electrode includes a semi-circular area; the radius of the semi-circular area of the source electrode of the first active switch is equal to the radius of the semi-circular area of the source electrode of the second active switch and the radius of the semi-circular area of the source electrode of the third active switch; a distance from the center of the semi-circular area of the source electrode of the first active switch to the drain electrode and a distance from the center of the semi-circular area of the source electrode of the second active switch to the drain electrode are less than a distance from the center of the semi-circular area of the source electrode of the third active switch to the drain electrode;

The first sub pixel includes a first light-emitting diode connected with the first active switch; the second sub pixel includes a second light-emitting diode connected with the second active switch; the third sub pixel includes a third light-emitting diode connected with the third active switch; the first, second and third light-emitting diodes all include a light-emitting area; and the area of the light-emitting area of the third light-emitting diode is greater than the areas of the light-emitting areas of the first light-emitting diode and the second light-emitting diode;

the ratio x of the opening rates of the first sub pixel and the third sub pixel is greater than or equal to 0.4, and less than 0.95; the value of x is 0.9, 0.85 or 0.8;

the ratio y of the opening rates of the second sub pixel and the third sub pixel is greater than or equal to 0.4, and less than 0.95; and the value of y is 0.9, 0.85 or 0.8.

The present application also provides a display apparatus including the display panel; the display panel includes a plurality of pixels; each of the pixels at least includes a first sub pixel, a second sub pixel and a third sub pixel corresponding to blue; the first sub pixel includes a first active switch; the second sub pixel includes a second active switch; the third sub pixel includes a third active switch; the opening rates of the first sub pixel and the second sub pixel are less than the opening rate of the third sub pixel; and the channel ratios of the first active switch and the second active switch are greater than the channel ratio of the third active switch.

Optionally, the first active switch, the second active switch and the third active switch all include a source electrode and a drain electrode; a channel is located between the source electrode and the drain electrode; the source electrode includes a semi-circular area; the radius of the semi-circular area of the source electrode of the first active switch is equal to the radius of the semi-circular area of the source electrode of the second active switch and the radius of the semi-circular area of the source electrode of the third active switch; a distance from the center of the semi-circular area of the source electrode of the first active switch to the drain electrode and a distance from the center of the semi-circular area of the source electrode of the second active switch to the drain electrode are less than a distance from the center of the semi-circular area of the source electrode of the third active switch to the drain electrode.

Optionally, the first active switch, the second active switch and the third active switch all include a source electrode and a drain electrode; a channel is located between the source electrode and the drain electrode; the source electrode includes a semi-circular area; a distance from the center of the semi-circular area of the source electrode of the first active switch to the drain electrode is equal to a distance from the center of the semi-circular area of the source electrode of the second active switch to the drain electrode and a distance from the center of the semi-circular area of the source electrode of the third active switch to the drain electrode; and the radius of the semi-circular area of the source electrode of the third active switch is less than the radius of the semi-circular area of the source electrode of the second active switch and the radius of the semi-circular area of the source electrode of the first active switch.

Optionally, the first sub pixel includes a first light-emitting diode connected with the first active switch; the second sub pixel includes a second light-emitting diode connected with the second active switch; the third sub pixel includes a third light-emitting diode connected with the third active switch; the first, second and third light-emitting diodes all include a light-emitting area; and the area of the light-emitting area of the third light-emitting diode is greater than the areas of the light-emitting areas of the first light-emitting diode and the second light-emitting diode.

Optionally, the ratio x of the opening rates of the first sub pixel and the third sub pixel is greater than or equal to 0.4, and less than 0.95.

Optionally, the value of x is 0.9, 0.85 or 0.8.

Optionally, the ratio y of the opening rates of the second sub pixel and the third sub pixel is greater than or equal to 0.4, and less than 0.95.

Optionally, the value of y is 0.9, 0.85 or 0.8.

Compared with the design scheme in which the same TFT (thin film transistor) is used for the sub pixels (corresponding to red, green and blue) of the organic light-emitting diodes of the white light-emitting area, the opening rate of the third sub pixel in the present application is greater than the opening rate of the first sub pixel and the opening rate of the second sub pixel, i.e., the opening rate corresponding to the blue sub pixel is the maximum, the problem of color offset occurred due to insufficient brightness of blue light after long time use. However, on the contrary, there will be a case in which brightness of the red light and the green light is insufficient, while the brightness depends on the current magnitude of the active switch, the current magnitude is also related to the magnitude of the channel ratio of the active switch, i.e., the greater the channel ratio is, the greater the corresponding color brightness is. Therefore, the channel ratio of the first active switch and the second active switch is greater than the channel ratio of the third active switch, which can solve the color offset occurred due to insufficient brightness of red light and green light.

BRIEF DESCRIPTION OF DRAWINGS

The drawings are included to provide further understanding of embodiments of the present application, which constitute a part of the specification and illustrate the embodiments of the present application, and describe the principles of the present application together with the text description. The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

Figure 1:
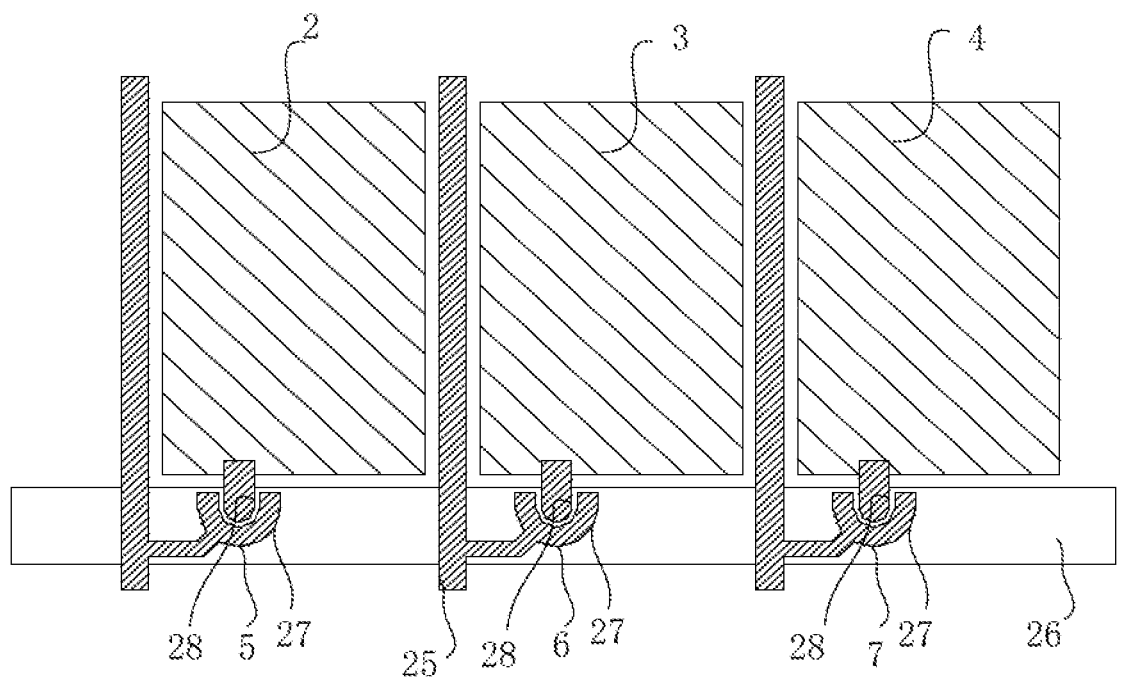
FIG. 1 is a schematic diagram of the basic conception of an organic light-emitting diode of one embodiment in the present application.
Figure 2:
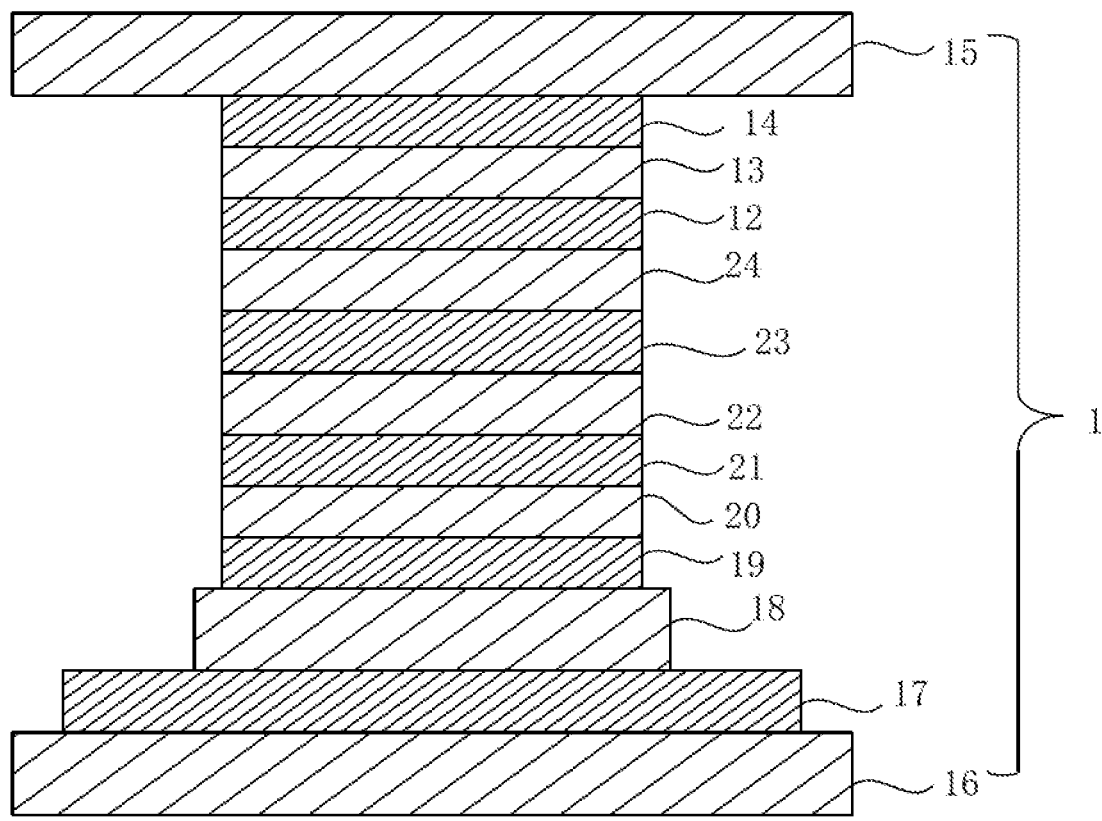
FIG. 2 is a schematic diagram of structures of the organic light-emitting diode and the organic light-emitting diode display of a color filter architecture of one embodiment in the present application.
Figure 3:
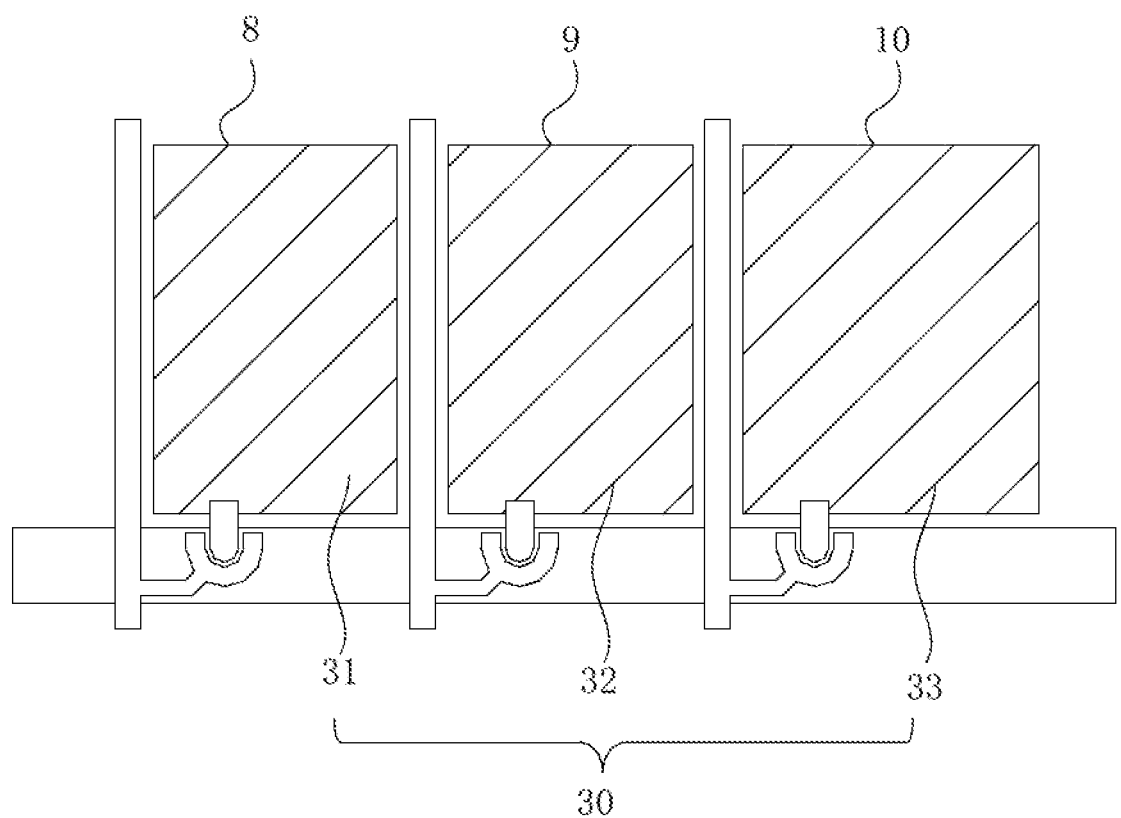
FIG. 3 is a schematic diagram of a structure of the organic light-emitting diode of one embodiment in the present application.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

In the figures, the units with a similar structure are represented by the same reference sign.

As shown in FIGS. 1 to 5, a display panel and a display apparatus of the present application are described in detail in embodiments.

A display panel 1 includes a plurality of pixels; each of the pixels at least includes a first sub pixel 2, a second sub pixel 3 and a third sub pixel 4 corresponding to blue; the first sub pixel 2 includes a first active switch 5 and a first light-emitting diode 8; the second sub pixel 3 includes a second active switch 6 and a second light-emitting diode 9; the third sub pixel 4 includes a third active switch 7 and a third light-emitting diode 10; the opening rates of the first sub pixel 2 and the second sub pixel 3 are less than the opening rate of the third sub pixel 4; and the channel ratios of the first active switch 5 and the second active switch 6 are greater than the channel ratio of the third active switch 7.

In this scheme, the opening rate of the third sub pixel 4 is greater than the opening rate of the first sub pixel 2 and the opening rate of the second sub pixel 3, i.e., the opening rate corresponding to the blue sub pixel is the maximum, the problem of color offset occurred due to insufficient brightness of blue light after long time use. However, on the contrary, there will be a case in which brightness of the red light and the green light is insufficient, while the brightness depends on the current magnitude of the active switch, the current magnitude is also related to the magnitude of the channel ratio of the active switch, i.e., the greater the channel ratio is, the greater the corresponding color brightness is. Therefore, the channel ratio of the first active switch 5 and the second active switch 6 is greater than the channel ratio of the third active switch 7, which can solve the problem of color offset occurred due to insufficient brightness of red light and green light.

Figure 4:
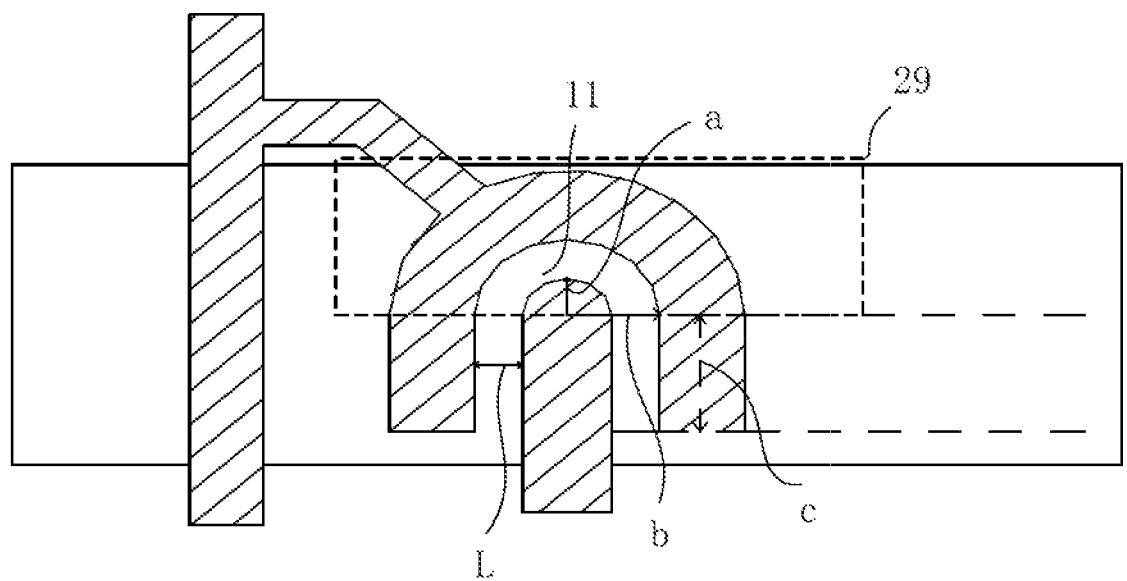
FIG. 4 is a schematic diagram of a channel of a thin film transistor of one embodiment in the present application.
Figure 5:
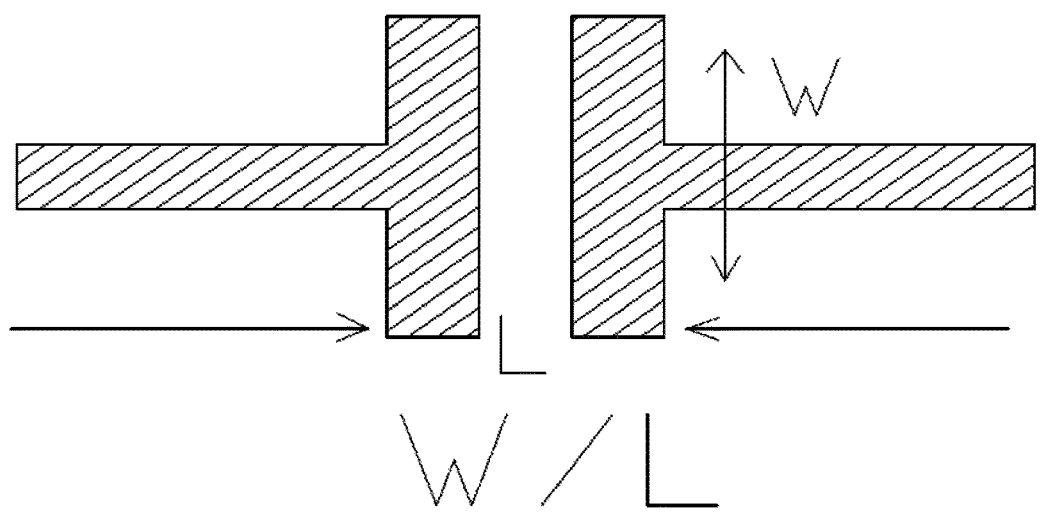
FIG. 5 is a schematic diagram of a parameter relationship of the channel ratio of the thin film transistor of one embodiment in the present application.
Figure 6:
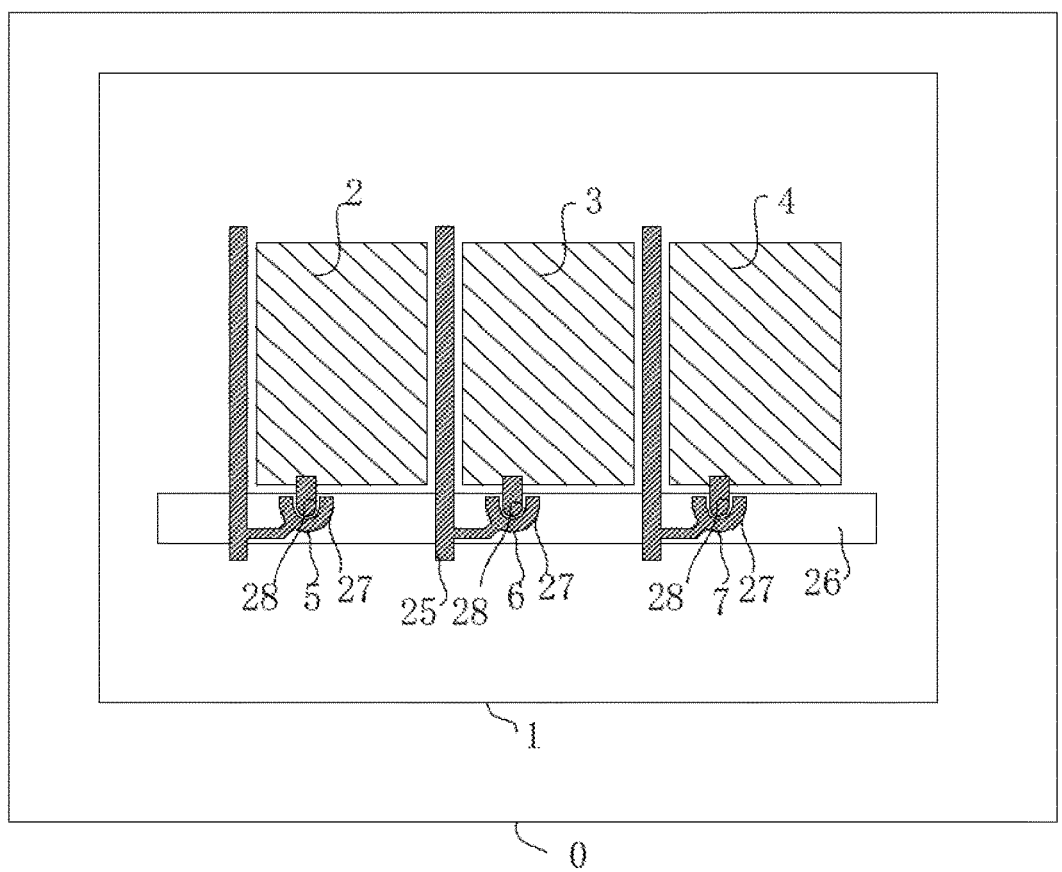
FIG. 6 is a schematic diagram of a display apparatus of one embodiment in the present application.

In one embodiment, the first active switch 5, the second active switch 6 and the third active switch 7 each include a source electrode 27 and a drain electrode 28; a channel 11 is located between the source electrode 27 and the drain electrode 28; the drain electrode 28 includes a semi-circular portion 29; in FIG. 4 the radius of the semi-circular portion of each of the first active switch 5, the second active switch 6, and the third active switch 7 is denoted by the letter "a", where the radius of the semi-circular portion 29 of the drain electrode 28 of the first active switch 5 is a1, the radius of the semi-circular portion 29 of the drain electrode 28 of the second active switch 6 is a2, and the radius of the semi-circular portion 29 of the drain electrode 28 of the third active switch 7 is a3; in FIG. 4, with respect to each of the first active switch 5, the second active switch 6, and the third active switch 7, the distance from the center of the semi-circular portion to the source electrode of the active switch is denoted by the letter "b", where a distance from the center of the semi-circular portion 29 of the first active switch 5 to the source electrode 27 is b1, a distance from the center of the semi-circular portion 29 of the second active switch 6 to the source electrode 27 is b2, and a distance from the center of the semi-circular portion 29 of the third active switch 7 to the source electrode 27 is b3, wherein a1=a2=a3, b1<b3, b2<b3. This scheme is also applicable when the drain electrode 28 of the active switch is not a semi-circular shape, so that the channel ratio of the first active switch 5 and the second active switch 6 is greater than the channel ratio of the third active switch 7.

In this scheme, since the channel ratio satisfies the formula $(W/L)=\pi/\ln[(2c+\pi b)/(2c+\pi a)]$, as can be seen from the formula regarding the channel ratio, to avoid color offset under a condition that the opening rates of the first sub pixel 2 and the second sub pixel 3 are less than the opening rate of the third sub pixel 4, the parameter of the channel ratio of the active switch may be designed as a1=a2=a3, b1<b3, b2<b3, so that the channel ratios of the first active switch 5 and the second active switch 6 are greater than the channel ratio of the third active switch 7, thereby solving the problem of color offset occurred due to insufficient brightness of red light and green light.

In one embodiment, b1=b2=b3, a3<a2, a3<a1.

In this scheme, since the channel ratio satisfies the formula $(W/L)=\pi/\ln[(2c+\pi b)/(2c+\pi a)]$, as can be seen from the formula regarding the channel ratio, to avoid color offset under a condition that the opening rates of the first sub pixel 2 and the second sub pixel 3 are less than the opening rate of the third sub pixel 4, the parameter of the channel ratio of the active switch may be designed as b1=b2=b3, a3<a2, a3<a1, so that the channel ratios of the first active switch 5 and the second active switch 6 are greater than the channel ratio of the third active switch 7, thereby solving the problem of color offset occurred due to insufficient brightness of red light and green light.

In one embodiment, the first sub pixel 2 includes a first light-emitting diode 8 connected with the first active switch 5; the second sub pixel 3 includes a second light-emitting diode 9 connected with a second active switch 6; the third sub pixel 4 includes a third light-emitting diode 10 connected with the third active switch 7; the first light-emitting diode 8, the second light-emitting diode 9 and the third active switch 10 all include a light-emitting area 30; and the area of the light-emitting area 33 of the third light emitting diode 10 is greater than the area of the light-emitting area 31 of the first light-emitting diode 8 and the area of the light-emitting area 32 of the second light-emitting diode 9.

In this scheme, the light-emitting area is translucent, then the greater the area is, the more the light transmission amount is; other conditions are constant but increasing the area of the light-emitting area of the third light-emitting diode 10, the opening rate and the brightness are increased, so that the problem of color offset occurred due to insufficient brightness of blue light can be solved.

In one embodiment, the ratio x of the opening rates of the first sub pixel 2 and the third sub pixel 4 is greater than or equal to 0.4, and less than 0.95.

In this scheme, as the brightness of the light-emitting diode is decided according to the material life, attenuation of the life of blue light is fast, making the light-emitting area of the blue light, i.e., the opening rate, large can prevent color offset of the display caused by insufficient brightness of blue light during long time use; and after experimental verification, the range of the opening rate of blue light can satisfy: the ratio x of the opening rates of the first sub pixel 2 and the third sub pixel 4 is greater than or equal to 0.4, and less than 0.95.

In one embodiment, the value of x is 0.9, 0.85 or 0.8.

In this scheme, the optional value of the ratio x of the opening rates of the first sub pixel 2 and the third sub pixel 4 is 0.9, 0.85 and 0.8, respectively; and when x is one of these values, color offset of the display panel 1 can be efficiently prevented.

In one embodiment, the ratio y of the opening rates of the second sub pixel 3 and the third sub pixel 4 is greater than or equal to 0.4, and less than 0.95.

In this scheme, as the brightness of the light-emitting diode is decided according to the material life, attenuation of the life of blue light is fast, making the light-emitting area of the blue light, i.e., the opening rate, large can prevent color offset of the display caused by insufficient brightness of blue light during long time use; and after experimental verification, the range of the opening rate of blue light can satisfy: the ratio y of the opening rates of the second sub pixel 3 and the third sub pixel 4 is greater than or equal to 0.4, and less than 0.95.

In one embodiment, the value of y is 0.9, 0.85 or 0.8.

In this scheme, the optional value of the ratio y of the opening rates of the second sub pixel 3 and the third sub pixel 4 is 0.9, 0.85 and 0.8, respectively; and when y is one of these values, color offset of the display panel 1 can be efficiently prevented.

In one embodiment, the light transmittance of the first sub pixel 2 and the second sub pixel 3 is less than the light transmittance of the third sub pixel 4.

In this scheme, red, green and blue lights in the organic white light-emitting diode area have the same light transmittance, but color offset will occur due to insufficient brightness of blue light after long time use, it potentially indicates that the brightness of red light and green light is higher than that of blue light, so that the light transmittance of red light and green light can be adjusted to be lower than the light transmittance of blue light, thereby solving the problem of color offset occurred due to insufficient brightness of blue light.

In one embodiment, the structure of the display panel 1 is constituted by stacking a back plate film 17, a filter layer 18, a cathode layer 19, an electron injection layer 20, an electron transport layer 21, a red light-emitting layer 22, a green light-emitting layer 23, a blue light-emitting layer 24, a hole transport layer 12, a hole injection layer 13, and an anode layer 14 bottom-up between an encapsulated layer 15 and a glass substrate layer 16, and the encapsulated layer 15 is the uppermost layer.

As shown in FIGS. 1 to 5, it discloses a display panel 1 including a plurality of pixels; each pixel at least includes a first sub pixel 2, a second sub pixel 3 and a third sub pixel 4 corresponding to blue; the first sub pixel 2 includes a first active switch 5; the second sub pixel 3 includes a second active switch 6; the third sub pixel 4 includes a third active switch 7; the opening rates of the first sub pixel 2 and the second sub pixel 3 are less than the opening rate of the third sub pixel 4; the channel ratios of the first active switch 5 and the second active switch 6 are greater than the channel ratio of the third active switch 7; the first sub pixel 2, the second sub pixel 3 and the third sub pixel 4 are connected to the same grid line 26 but to different data lines 25; and the channel is located in the active switch which may be a thin film transistor;

The first active switch 5, the second active switch 6 and the third active switch 7 all include a source electrode 27 and a drain electrode 28; a channel 11 is located between the source electrode 27 and the drain electrode 28; the source electrode 27 includes a semi-circular portion 29; in FIG. 4 the radius of the semi-circular portion of each of the first active switch 5, the second active switch 6, and the third active switch 7 is denoted by the letter "a" where the radius of the semi-circular portion 29 of the drain electrode 28 of the first active switch 5 is a1, the radius of the semi-circular portion 29 of the drain electrode 28 of the second active switch 6 is a2, and the radius of the semi-circular portion 29 of the drain electrode 28 of the third active switch 7 is a3; in FIG. 4, with respect to each of the first active switch 5, the second active switch 6, and the third active switch 7, the distance from the center of the semi-circular portion to the source electrode of the active switch is denoted by the letter "b" where a distance from the center of the semi-circular portion 29 of the first active switch 5 to the source electrode 27 is b1, a distance from the center of the semi-circular portion 29 of the second active switch 6 to the source electrode 27 is b2, and a distance from the center of the semi-circular portion 29 of the third active switch 7 to the source electrode 27 is b3, wherein a1=a2=a3, b1<b3, b2<b3. This scheme is also applicable when the drain electrode 28 of the active switch is not a semi-circular shape, so that the channel ratio of the first active switch 5 and the second active switch 6 is greater than the channel ratio of the third active switch 7;

The first sub pixel 2 includes a first light-emitting diode 8 connected with the first active switch 5; the second sub pixel 3 includes a second light-emitting diode 9 connected with a second active switch 6; the third sub pixel 4 includes a third light-emitting diode 10 connected with the third active switch 7; the first light-emitting diode 8, the second light-emitting diode 9 and the third active switch 10 all include a light-emitting area 30; and the area of the light-emitting area 31 of the third light emitting diode 10 is greater than the area of the light-emitting area 32 of the first light-emitting diode 8 and the area of the light-emitting area 33 of the second light-emitting diode 9;

The ratio x of the opening rates of the first sub pixel 2 and the third sub pixel 4 is greater than or equal to 0.4, and less than 0.95;

The ratio y of the opening rates of the second sub pixel 3 and the third sub pixel 4 is greater than or equal to 0.4, and less than 0.95;

The light transmittance of the first sub pixel 2 and the second sub pixel 3 is less than the light transmittance of the third sub pixel 4.

In this scheme, the sub pixels (corresponding to red, green and blue) of the organic light-emitting diode in the white light-emitting area use the same design of TFT (thin film transistor) and opening rate. In the present application, the opening rate of the third sub pixel 4 is greater than the opening rate of the first sub pixel 2 and the opening rate of the second sub pixel 3, i.e., the opening rate corresponding to the blue sub pixel is the maximum, so that the problem of color offset occurred due to insufficient brightness of blue light can be solved after long time use. However, on the contrary, the situation of insufficient brightness of red light and green light occurs. The brightness depends on the current magnitude of the active switch, and the current magnitude is related to the channel ratio of the active switch, i.e., the greater the channel ratio is, and the greater the brightness of corresponding color is. Therefore, the channel ratios of the first active switch 5 and the second active switch 6 are greater than the channel ratio of the third active switch 7, so that the problem of color offset occurred due to insufficient brightness of red light and green light can be solved. Since the channel ratio satisfies the formula (W/L)= $+\pi/\ln [(2c+\pi b)/(2c+\pi a)]$, as can be seen from the formula regarding the channel ratio, to avoid color offset under a condition that the opening rates of the first sub pixel 2 and the second sub pixel 3 are less than the opening rate of the third sub pixel 4, the parameter of the channel ratio of the active switch may be designed as that the radius of the semi-circular portion of the drain electrode 28 of the first active switch 5 is equal to the radius of the semi-circular portion of the drain electrode 28 of the second active switch 6 and the radius of the semi-circular portion of the drain electrode 28 of the third active switch 7, and a distance from the center of the semi-circular portion of drain electrode 28 of the first active switch 5 to the source electrode 27 and a distance from the center of the semi-circular portion of the drain electrode 28 of the second active switch 6 to the source electrode 27 are less than a distance from the center of the semi-circular portion of the drain electrode 28 of the third active switch 7 to the source electrode 27, so that the channel ratios of the first active switch 5 and the second active switch 6 can be greater than the channel ratio of the third active switch 7, thereby solving the problem of color offset occurred due to insufficient brightness of red light and green light; the light-emitting area is translucent, then the greater the area is, the more the light transmission amount is; other conditions are constant but increasing the area of the light-emitting area of the third light-emitting diode 10, the opening rate and the brightness are increased, so that the problem of color offset occurred due to insufficient brightness of blue light can be solved; as the brightness of the light-emitting diode is decided according to the material life, attenuation of the life of blue light is fast, making the light-emitting area of the blue light, i.e., the opening rate, large can prevent color offset of the display caused by insufficient brightness of blue light during long time use; and after experimental verification, the range of the opening rate of blue light can satisfy: the ratio x of the opening rates of the first sub pixel 2 and the third sub pixel 4 is greater than or equal to 0.4, and less than 0.95; as the brightness of the light-emitting diode is decided according to the material life, attenuation of the life of blue light is fast, making the light-emitting area of the blue light, i.e., the opening rate, large can prevent color offset of the display caused by insufficient brightness of blue light during long time use; and after experimental verification, the range of the opening rate of blue light can satisfy: the ratio y of the opening rates of the second sub pixel 3 and the third sub pixel 4 is greater than or equal to 0.4, and less than 0.95; and red, green and blue lights in the organic white light-emitting diode area have the same light transmittance, but color offset will occur due to insufficient brightness of blue light after long time use, it potentially indicates that the brightness of red light and green light is higher than that of blue light, so that the light transmittance of red light and green light can be adjusted to be lower than the light transmittance of blue light, thereby solving the problem of color offset occurred due to insufficient brightness of blue light.

As shown in FIGS. 1 to 6, it discloses a display apparatus 0 including a display panel 1; the display panel 1 includes a plurality of pixels; each of the pixels at least includes a first sub pixel 2, a second sub pixel 3 and a third sub pixel 4 corresponding to blue; the first sub pixel 2 includes a first active switch 5 and a first light-emitting diode 8; the second sub pixel 3 includes a second active switch 6 and a second light-emitting diode 9; the third sub pixel 4 includes a third active switch 7 and a third light-emitting diode 10; the opening rates of the first sub pixel 2 and the second sub pixel 3 are less than the opening rate of the third sub pixel 4; and the channel ratios of the first active switch 5 and the second active switch 6 are greater than the channel ratio of the third active switch 7.

The above contents are detailed optional descriptions for the present application in conjunction with the specific optional implementation, and it cannot be affirmed that the specific implementation of the present application is only limited to these descriptions. For those skilled in the art of the present application, several simple deductions or replacements can further be made without departing from the idea of the present application and should be deemed as belonging to the scope of protection of the present application.

What is claimed is:

1. A display panel, comprising:
   a plurality of pixels, wherein each of the pixels comprises a first sub pixel, a second sub pixel, and a third sub pixel corresponding to blue, wherein the first sub pixel comprises a first active switch, the second sub pixel comprises a second active switch, and the third sub pixel comprises a third active switch;

wherein opening rates of the first sub pixel and the second sub pixel are each less than an opening rate of the third sub pixel; and wherein channel ratios of the first active switch and the second active switch are each greater than a channel ratio of the third active switch.

2. The display panel according to claim 1, wherein each of the first active switch, the second active switch, and the third active switch comprises a source electrode and a drain electrode, a channel is located between the source electrode and the drain electrode, and the drain electrode comprises a semi-circular portion;

wherein a radius of the semi-circular portion of the drain electrode of the first active switch is equal to a radius of the semi-circular portion of the drain electrode of the second active switch and to a radius of the semi-circular portion of the drain electrode of the third active switch; and wherein a distance from a center of the semi-circular portion of the drain electrode of the first active switch to the source electrode of the first active switch and a distance from a center of the semi-circular portion of the drain electrode of the second active switch to the source electrode of the second active switch are each less than a distance from a center of the semi-circular portion of the drain electrode of the third active switch to the source electrode of the third active switch.

3. The display panel according to claim 2, wherein each of the drain electrodes of the first, second, and third active switches comprises the semi-circular portion and further comprises an elongated rectangular portion joined with the semi-circular portion, wherein a width at one end of the elongated rectangular portion is equal to and coincides with the diameter of the semi-circular portion.

4. The display panel according to claim 3, wherein each of the source electrodes of the first, the second, and the third active switches comprises a partial annular portion having two ends, and further comprises two identical rectangular portions respectively joined with the two ends of the annular portion thus defining a U-shaped hollow enclosed by the partial annular portion and the two rectangular portions, wherein each of the source electrodes of the first, the second and the third active switches are symmetric with respect to the respective drain electrode, with the drain electrode partially disposed in the U-shaped hollow and partially extending out of a line connecting widths of two outer ends of the rectangular portions of the source electrode.

5. The display panel according to claim 4, wherein with respect to each of the first, the second, and the third active switches, let a length of each of the two rectangular portions of the source electrode be c, the radius of the semi-circular portion of the respective drain electrode be a, and the distance from the center of the drain electrode to an inner edge of the source electrode be b, then the channel ratio of this active switch satisfies the following formula:

$$\text{channel ratio}(W/L)=\pi/\ln\,[(2c+\pi b)/(2c+\pi a)].$$

6. The display panel according to claim 1, wherein each of the first active switch, the second active switch, and the third active switch comprises a source electrode and a drain electrode, a channel is located between the source electrode and the drain electrode, and wherein the drain electrode comprises a semi-circular portion;

wherein a distance from a center of the semi-circular portion of the drain electrode of the first active switch to the source electrode of the first active switch is equal to a distance from a center of the semi-circular portion of the drain electrode of the second active switch to the source electrode of the second active switch and to a distance from a center of the semi-circular portion of the drain electrode of the third active switch to the source electrode of the third active switch; and wherein a radius of the semi-circular portion of the drain electrode of the third active switch is less than each of a radius of the semi-circular portion of the drain electrode of the second active switch and a radius of the semi-circular portion of the drain electrode of the first active switch.

7. The display panel according to claim 1, wherein the first sub pixel comprises a first light-emitting diode connected with the first active switch; the second sub pixel comprises a second light-emitting diode connected with the second active switch; the third sub pixel comprises a third light-emitting diode connected with the third active switch; and the first, second, and third light-emitting diodes each comprise a light-emitting area; and wherein an area of the light-emitting area of the third light-emitting diode is greater than that of each of the light-emitting areas of the first and second light-emitting diodes.

8. The display panel according to claim 1, wherein a ratio x of the opening rate of the first sub pixel to the opening rate of the third sub pixel is greater than or equal to 0.4 and less than 0.95.

9. The display panel according to claim 8, wherein the value of x is 0.9, 0.85 or 0.8.

10. The display panel according to claim 1, wherein a ratio y of the opening rate of the second sub pixel to the opening rate of the third sub pixel is greater than or equal to 0.4 and less than 0.95.

11. The display panel according to claim 10, wherein the value of y is 0.9, 0.85 or 0.8.

12. The display panel according to claim 1, wherein a light transmittance of the first sub pixel and the second sub pixel is less than that of the third sub pixel.

13. The display panel according to claim 1, wherein the display panel comprises a glass substrate layer, a back plate film, a filter layer, a cathode layer, an electron injection layer, an electron transport layer, a red light-emitting layer, a green light-emitting layer, a blue light-emitting layer, a hole transport layer, a hole injection layer, an anode layer, and an encapsulated layer 15 that are stacked one over the other in the above order, wherein the encapsulated layer 15 is an uppermost layer.

14. The display panel according to claim 1, wherein the first subpixel is arranged adjacent to the second subpixel, and the third subpixel is arranged adjacent to the second subpixel.

15. A display panel, comprising a plurality of pixels, wherein, each of the pixels at least comprises a first sub pixel, a second sub pixel, and a third sub pixel corresponding to blue; the first sub pixel comprises a first active switch; the second sub pixel comprises a second active switch; the third sub pixel comprises a third active switch; opening rates of the first sub pixel and the second sub pixel are each less than an opening rate of the third sub pixel; and channel ratios of the first active switch and the second active switch are each greater than a channel ratio of the third active switch;

wherein the first active switch, the second active switch, and the third active switch each comprises a source electrode and a drain electrode; a channel is located between the source electrode and the drain electrode; the source electrode comprises a semi-circular portion; a radius of the semi-circular portion of the drain electrode of the first active switch is equal to a radius of the semi-circular portion of the drain electrode of the second active switch and to a radius of the semi-circular portion of the drain electrode of the third active switch; a distance from a center of the semi-circular portion of the drain electrode of the first active switch to the source electrode of the first active switch and a distance from a center of the semi-circular portion of the drain electrode of the second active switch to the source electrode of the second active switch are each less than a distance from a center of the semi-circular portion of the drain electrode of the third active switch to the source electrode of the third active switch;

the first sub pixel comprises a first light-emitting diode connected with the first active switch; the second sub pixel comprises a second light-emitting diode connected with the second active switch; the third sub pixel comprises a third light-emitting diode connected with the third active switch; the first, second, and third light-emitting diodes each comprises a light-emitting area; and an area of the light-emitting area of the third light-emitting diode is greater than each of areas of the light-emitting areas of the first light-emitting diode and the second light-emitting diode; and wherein a ratio x of the opening rate of the first sub pixel to the opening rate of the third sub pixel is greater than or equal to 0.4 and less than 0.95; the value of x is 0.9, 0.85 or 0.8; and wherein a ratio y of the opening rate of the second sub pixel to the opening rate of the third sub pixel is greater than or equal to 0.4 and less than 0.95; and the value of y is 0.9, 0.85 or 0.8.

16. A display apparatus, comprising a display panel that comprises:
a plurality of pixels, wherein each of the pixels comprises a first sub pixel, a second sub pixel, and a third sub pixel corresponding to blue, wherein the first sub pixel comprises a first active switch, the second sub pixel comprises a second active switch, and the third sub pixel comprises a third active switch;
wherein opening rates of the first sub pixel and the second sub pixel are each less than an opening rate of the third sub pixel; and
wherein channel ratios of the first active switch and the second active switch are each greater than a channel ratio of the third active switch.

17. The display apparatus according to claim 16, wherein each of the first active switch, the second active switch, and the third active switch comprises a source electrode and a drain electrode, a channel is between the source electrode and the drain electrode, and wherein the source electrode comprises a semi-circular portion;
wherein a radius of the semi-circular portion of the drain electrode of the first active switch is equal to a radius of the semi-circular portion of the drain electrode of the second active switch and to a radius of the semi-circular portion of the drain electrode of the third active switch; and
wherein a distance from a center of the semi circular portion of the drain electrode of the first active switch to the source electrode of the first active switch and a distance from a center of the semi-circular portion of the drain electrode of the second active switch to the source electrode of the second active switch are each less than a distance from a center of the semi-circular portion of the drain electrode of the third active switch to the source electrode of the third active switch.

18. The display apparatus according to claim 16, wherein each of the first active switch, the second active switch, and the third active switch comprises a source electrode and a drain electrode, a channel is between the source electrode and the drain electrode, and wherein the drain electrode comprises a semi-circular portion;
wherein a distance from the center of the semi-circular portion of the drain electrode of the first active switch to the source electrode of the first active switch is equal to a distance from a center of the semi-circular portion of the drain electrode of the second active switch to the source electrode of the second active switch and to a distance from a center of the semi-circular portion of the drain electrode of the third active switch to the source electrode of the third active switch; and
wherein a radius of the semi-circular portion of the drain electrode of the third active switch is less than each of a radius of the semi-circular portion of the drain electrode of the second active switch and a radius of the semi-circular portion of the drain electrode of the first active switch.

19. The display apparatus according to claim 16, wherein the first sub pixel comprises a first light-emitting diode connected with the first active switch; the second sub pixel comprises a second light-emitting diode connected with the second active switch; the third sub pixel comprises a third light-emitting diode connected with the third active switch; and the first, second, and third light-emitting diodes each comprise a light-emitting area; and
wherein an area of the light-emitting area of the third light-emitting diode is greater than that of each of the light-emitting areas of the first and second light-emitting diodes.

20. The display apparatus according to claim 16, wherein a ratio x of the opening rate of the first sub pixel to the opening rate of the third sub pixel is greater than or equal to 0.4 and less than 0.95.

* * * * *